(12) United States Patent
Rearick et al.

(10) Patent No.: US 7,411,407 B2
(45) Date of Patent: Aug. 12, 2008

(54) TESTING TARGET RESISTANCES IN CIRCUIT ASSEMBLIES

(75) Inventors: Jeffrey R. Rearick, Fort Collins, CO (US); Jacob L. Bell, Vancouver, WA (US)

(73) Assignee: Agilent Technologies, Inc., Santa Clara, CA (US)

( * ) Notice: Subject to any disclaimer, the term of this patent is extended or adjusted under 35 U.S.C. 154(b) by 43 days.

(21) Appl. No.: 11/581,203

(22) Filed: Oct. 13, 2006

(65) Prior Publication Data

US 2007/0143047 A1    Jun. 21, 2007

(51) Int. Cl.
   *G01R 27/08* (2006.01)
(52) U.S. Cl. .................. 324/713; 324/704; 324/705
(58) Field of Classification Search .......... 324/549, 324/704, 705, 713
   See application file for complete search history.

(56) References Cited

U.S. PATENT DOCUMENTS

| | | | |
|---|---|---|---|
| 5,117,129 A | | 5/1992 | Hoffman et al. |
| 5,361,032 A | * | 11/1994 | Waterbly .................. 324/765 |
| 5,682,392 A | | 10/1997 | Raymond et al. |
| 5,796,260 A | | 8/1998 | Agan |
| 5,977,775 A | | 11/1999 | Chandler et al. |
| 6,275,962 B1 | | 8/2001 | Fuller et al. |
| 6,324,485 B1 | | 11/2001 | Ellis |
| 6,365,859 B1 | | 4/2002 | Yi et al. |
| 6,396,279 B1 | | 5/2002 | Gruenert |
| 6,397,361 B1 | | 5/2002 | Saitoh |
| 6,448,865 B1 | | 9/2002 | Miller |
| 6,456,124 B1 | * | 9/2002 | Lee et al. .................. 327/108 |
| 6,556,938 B1 | | 4/2003 | Rohrbaugh et al. |
| 6,577,980 B1 | | 6/2003 | Sheptson et al. |
| 6,586,921 B1 | | 7/2003 | Sunter |
| 6,658,613 B2 | | 12/2003 | Rearick et al. |
| 6,661,250 B2 | * | 12/2003 | Kim et al. .................. 326/30 |
| 6,725,171 B2 | * | 4/2004 | Baur et al. .................. 324/765 |
| 6,762,614 B2 | | 7/2004 | Rearick et al. |
| 6,963,212 B2 | | 11/2005 | Brown |

* cited by examiner

*Primary Examiner*—Timothy J Dole

(57) ABSTRACT

A test system includes a circuit assembly having an IC and an external circuit. The IC includes test circuitry used to observe data indicative of target resistances in the external circuit. The test system evaluates the data to determine target resistance values. A first embodiment measures two output voltages responsive to a time varying reference voltage. The two output voltages can be used to determine resistance values in the external circuit. A second embodiment enables logic contention on the IC, controllably fixes a pull-down element on the IC, and controllably sweeps a pull-up element on the IC until the voltage at a node between the pull-down and pull-up elements and coupled to an external circuit exceeds a reference voltage.

19 Claims, 12 Drawing Sheets

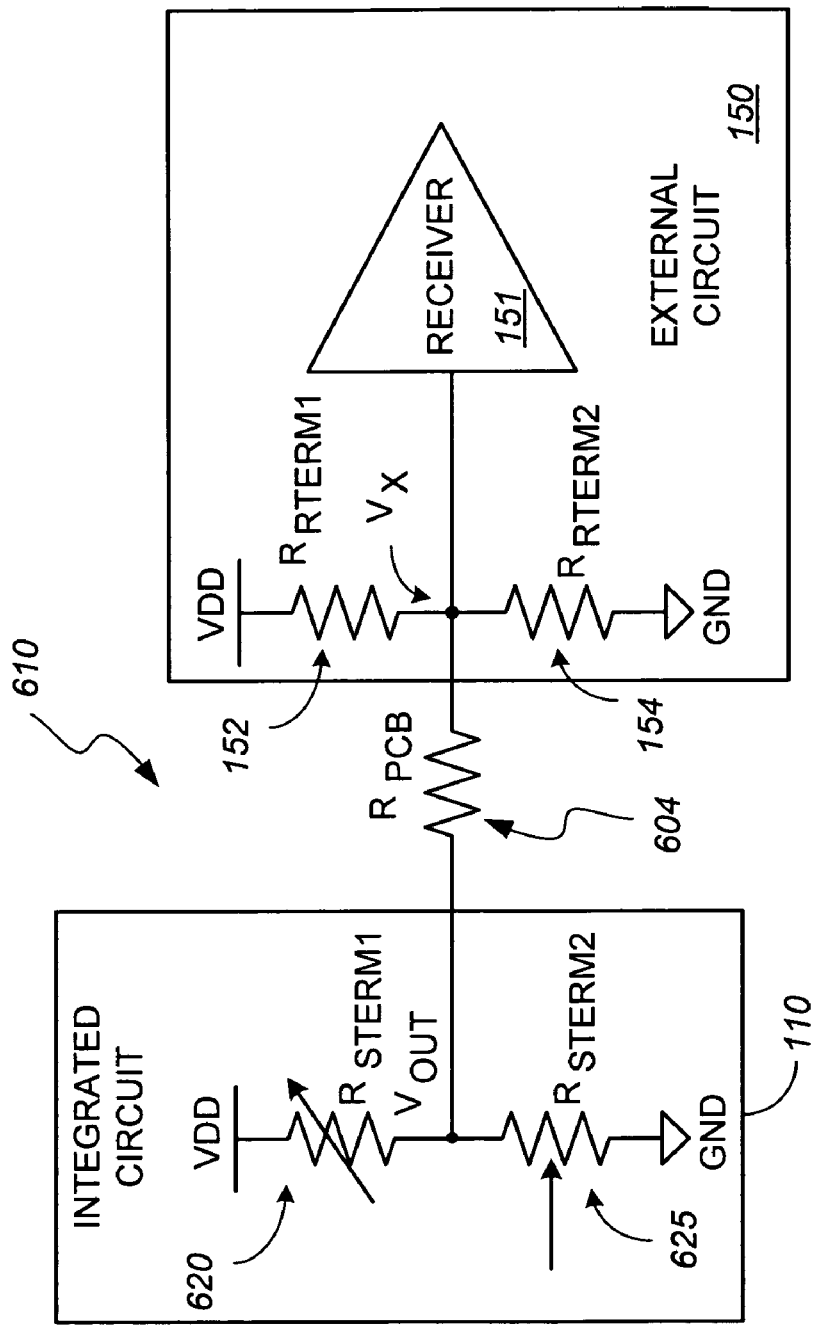

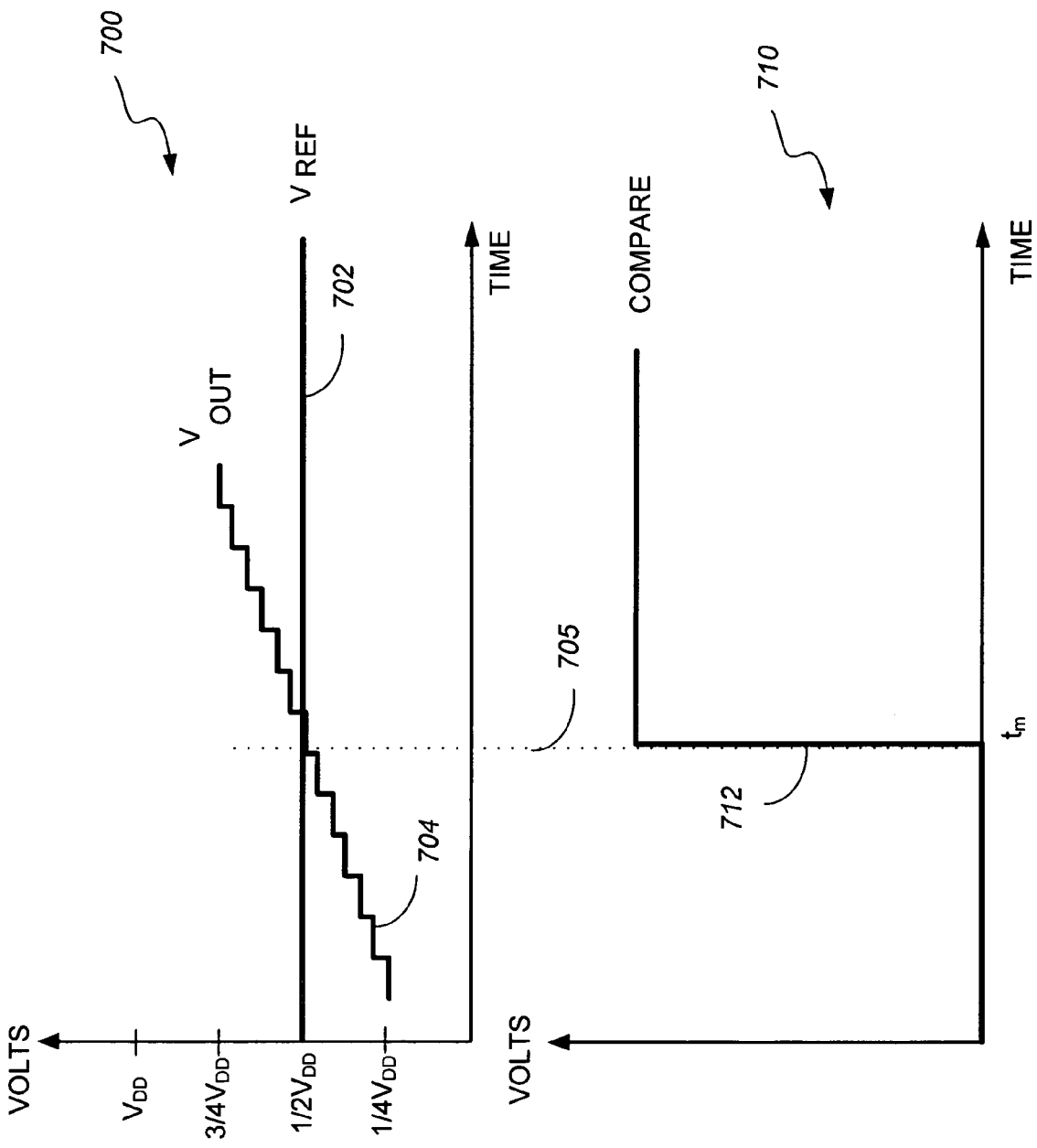

TESTING TARGET RESISTANCES IN CIRCUIT ASSEMBLIES

BACKGROUND

Modern printed circuit assemblies continue to have a greater density of attached parts. As both the density and number of parts per circuit board increases, the number of interconnected nodes to be tested rises exponentially, but the physical access to those nodes decreases. The addition of daughter cards and sub-assemblies further compounds the problem. As circuits and circuit assemblies increase in complexity, the cost of testing these circuits and circuit assemblies, e.g., an arrangement including a motherboard and one or more daughter boards, increases as well.

Steady increases in the performance requirements of printed circuit assemblies have further complicated test hardware. For example, input/output (I/O) data interfaces often now use passive elements (such as termination resistors and coupling capacitors) to satisfy the signal integrity requirements of high-frequency data signals. Some circuits use surface mount passive devices that can be difficult to place and solder correctly given their compact size. As a result, keeping up with test requirements is expensive, particularly when it is not possible to physically access nodes to be tested (for example, when the node exists on a printed circuit board trace that is on a surface obscured by other components or boards or when the node comprises a solder joint intended to couple a small (in size) surface mount resistor). Such nodes often either are not tested at all or are tested using indirect access methods, which typically have long test times and less than ideal resolution.

Less than complete test verification of circuit assembly nodes results in uncertainty regarding the ultimate operation of the circuit assembly in its intended device. The greater number of nodes not verified increases the uncertainty of whether the circuit assembly will meet all performance expectations when in operation.

Thus, there is a need for improved systems and methods for verifying expected conditions, which address these and/or other shortcomings of the prior art.

SUMMARY

Systems and methods for testing target resistances in circuit assemblies are provided. An embodiment of a system includes a circuit assembly having an integrated circuit (IC) and a circuit external to the IC. The IC comprises test circuitry used to observe data indicative of target resistances associated with the external circuit. The system evaluates the data to determine target resistance values.

An alternative embodiment of a system for determining a target resistance of an external circuit coupled to an IC comprises an IC with test circuitry, a first data store, a second data store, and logic. The test circuitry applies a reference voltage that varies over time and first and second output voltages that are different from each other. The first data store records a representation of a first reference voltage responsive to a first stimulus from within the IC when the reference voltage is substantially equal to the first output voltage. The second data store records a representation of a second reference voltage responsive to a second stimulus from within the IC when the reference voltage is substantially equal to the second output voltage. The logic determines first and second values associated with an electrical characteristic of the external circuit responsive to the first and second reference voltages.

An embodiment of an IC enabled method for determining an electrical characteristic in a circuit assembly of a coupled circuit external to the IC, comprises the steps of providing a reference voltage that varies in magnitude over time, providing a first input that directs the IC to transmit a first output voltage to a circuit external to the IC, monitoring the first output voltage within the IC, generating a first signal when the first output voltage is substantially equal to the reference voltage, storing the magnitude of the reference voltage responsive to the first signal, replacing the first input with a second input that directs the IC to transmit a second output voltage different from the first output voltage to the circuit external to the IC, monitoring the second output voltage within the IC, generating a second signal when the second output voltage is substantially equal to the reference voltage, storing the magnitude of the reference voltage responsive to the second signal and determining a value of an electrical characteristic of the circuit external to the IC responsive to the first and second input signals and the reference voltage.

BRIEF DESCRIPTION OF THE DRAWINGS

Features illustrated in the drawings are not necessarily to scale, emphasis instead being placed on clearly illustrating the principles of the present circuits and methods for testing target resistances in circuit assemblies.

FIG. 6C is an embodiment of a circuit diagram depicting resistances in an input termination network on the IC of FIG. 1.

FIGS. 7A and 7B are graphs illustrating how a voltage is determined by an IC using the circuit of FIG. 6C.

DETAILED DESCRIPTION

A test system includes a circuit assembly having an IC and an external circuit. The IC comprises test circuitry used to observe data indicative of target resistances associated with the external circuit. The test system evaluates the data to determine target resistance values. A first embodiment measures two output voltages responsive to a time varying reference voltage. The two output voltages can be used to determine resistance values in the external circuit. A second embodiment disables a driver on the IC, controllably fixes a pull-down termination element in the IC, controllably sweeps a pull-up termination element in the IC until the voltage at a node between the termination elements and coupled to the external circuit exceeds a reference voltage.

The IC is configured such that the IC provides both the measurement stimuli and receives the measurement results. Consequently, the IC can be used to check both the existence and an appropriate value of a target resistance as seen by the IC along a connection that couples the IC to an external circuit or circuit device without the need for expensive test equipment. The external device can be a receiver circuit coupled to the IC. The receiver can be embodied on a printed circuit board that hosts both the IC and the receiver circuit. Alternatively, the receiver can be embodied on a separate printed circuit board coupled to the IC via a wire or other flexible conductor.

A direct-coupled (DC) reference voltage is compared with an input signal. A measurement stimulus is generated when the input signal exceeds the reference voltage. The system responds by identifying the reference voltage level that produced the measurement stimulus. The reference voltage level is recorded in a data storage element within the IC. Alternatively or additionally, the reference voltage level can be sent to a storage element external to the IC. As will be described in greater detail below, test circuitry within the IC is arranged to determine target resistance values associated with the receiver circuit within the external circuit or circuit device. In other embodiments, the test circuitry within the IC is arranged to identify a fault condition within the signal termination element(s) of the external device.

Figure 1:
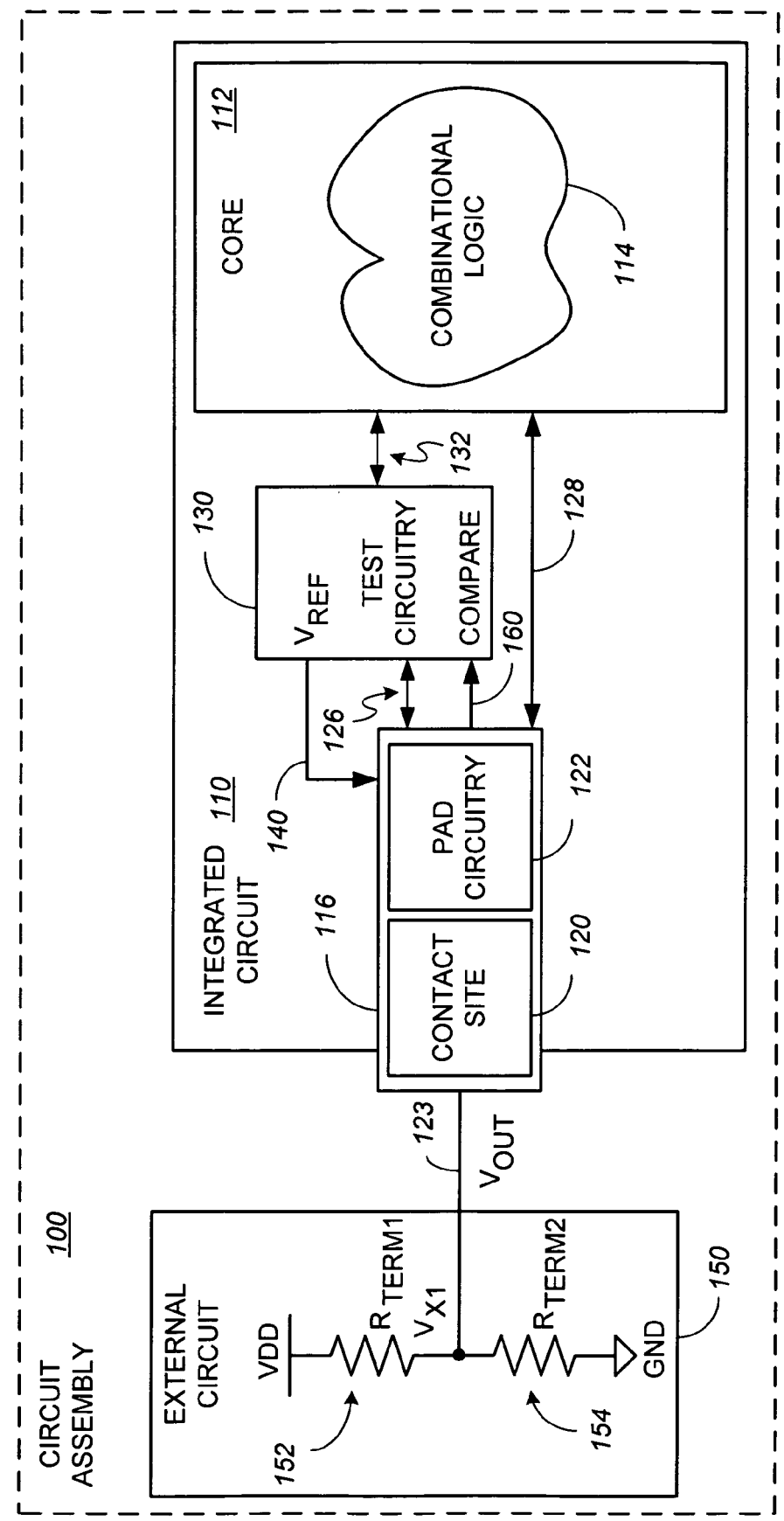
FIG. 1 is a schematic diagram depicting an embodiment of a circuit assembly.

Reference will now be made in detail to the description of the systems and methods for testing target resistances in circuit assemblies as illustrated in the drawings, with like numerals indicating like parts throughout the several views. Referring now to FIG. 1, a representative circuit assembly 100 includes IC 110 and external circuit 150. IC 110 includes core 112, which incorporates combinational logic 114 and electrically communicates with external circuit 150 via pad 116. Pad 116 and core 112 are coupled via connection 128, which provides a medium for one or more data signals. Although only a single pad 116 is shown in the illustrated embodiment, it will be understood that typical integrated circuits will comprise a host of pads to receive one or more supply voltages, one or more clock signals, provide an electrical ground, and enable additional data signals to be communicated with one or more additional external devices (not shown).

Pad 116, includes contact site 120 and pad circuitry 122. Contact site 120 couples the IC 110 via conductor 123 with external circuit 150. Pad circuitry 122 cooperates with the contact site 120 to enable electrical communication between components of the IC and components external to the IC. As is known, pad circuitry 122 may include one or more receivers, for receiving signals provided to pad 116 from external devices, and one or more drivers, for providing signals from pad 116 to external devices.

Additionally, integrated circuit 110 includes test circuitry 130. Test circuitry 130 communicates with core 112 via conductor 132 and with pad 116 via multiple connections. Test circuitry 130 provides a voltage, $V_{REF}$, via conductor 140 to pad 116. Test circuitry 130 receives a measurement stimulus signal, COMPARE, via conductor 160 from pad 116. In addition, one or more additional control and data signals are communicated via connection 126 between pad 116 and test circuitry 130.

In the illustrated embodiment, test circuitry 130 resides outside core 112 and outside pad 116. It should be noted that various other arrangements of test circuitry 130 may be used, such as arranging the test circuitry 130 within core 112 and/or within pad 116. Moreover, test circuitry 130 may be configured to communicate with external test equipment (not shown) via one or more pads other than pad 116.

By providing test circuitry 130 on IC 110, target resistances within external circuit 150 can be verified and quantified utilizing IC 110. This arrangement facilitates efficient and effective testing of circuit assemblies that for one reason or another do not provide ready access for test equipment to observe electrical characteristics along specified data connections. For example, IC 110 can verify and quantify the values of termination elements, such as $R_{TERM1}$ 152 and $R_{TERM2}$ 154, used to provide signal termination in external circuit 150. It is significant to note that while termination elements 152, 154 illustrated in FIG. 1 are shown as integrated (i.e., internal) devices, these elements can be discrete devices such as resistors or transistors coupled to conductor 123 on a printed circuit board or some other assembly between external circuit 150 and IC 110.

Figure 2:
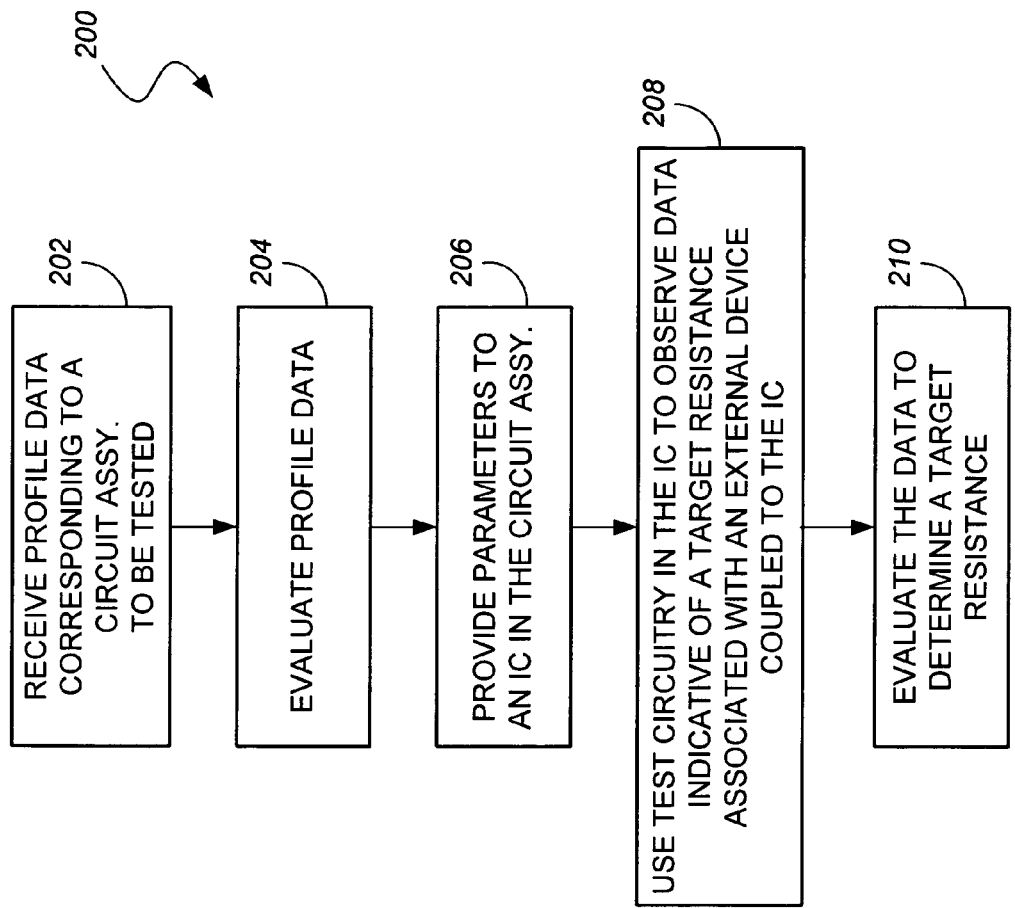
FIG. 2 is a flow diagram depicting an embodiment of a method for determining a target resistance on an external device.

The flow diagram of FIG. 2 shows an embodiment of a method 200 for identifying a target resistance that can be implemented by the circuit assembly 100 of FIG. 1. In this regard, as shown in block 202, profile data corresponding to the circuit assembly 100 (FIG. 1) to be tested is received. Such profile data may include, but is not limited to, information relating to the type of IC and/or electrical continuity information corresponding to the interconnection of IC 110 (FIG. 1) with external circuit 150 (FIG. 1) and perhaps other devices. The profile data may be provided in numerous manners, such as by being provided in the form of an operator input at a work station or via a netlist or other representation of the circuit of interest in response to a test initiation signal. After receiving the profile data, method 200 proceeds to block 204 where the profile data is evaluated, i.e., a determination is made as to what tests should be performed on a select connection of the circuit assembly 100.

At block 206, parameters are provided to an IC 110 within the circuit assembly 100 to direct test circuitry 130 within IC 110 to collect data regarding electrical characteristics associated with conductor 123 between IC 110 and external circuit 150. Test parameters include appropriate signals to facilitate resistance testing. As indicated in block 208, test circuitry in the IC is used to observe data indicative of a target resistance associated with an external device (e.g., external circuit 150) coupled to IC 110. Data is received, such as by the test circuitry 130, with the data being received in any suitable manner, e.g., intermittently throughout the testing cycle, or after testing has been completed. At block 210, the received data is evaluated to identify a value of a target resistance. It will be understood that subsequent to the data evaluation in block 210, the test circuitry 130 or a device external to the IC 110 can be programmed to make a determination that the IC 110 and the coupled external circuit 150 are functioning as desired.

Figure 3:
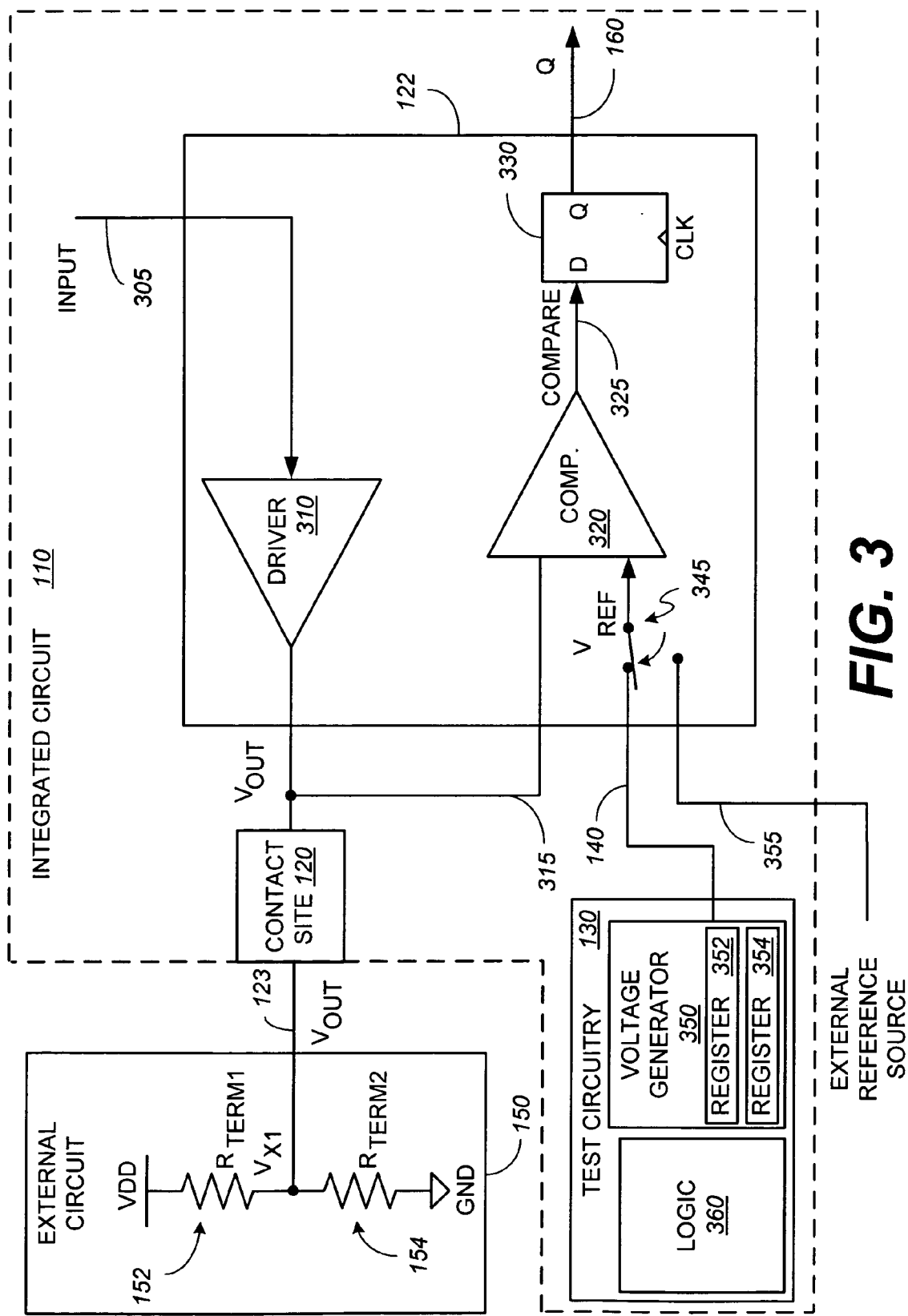
FIG. 3 is a circuit schematic of an embodiment of the pad circuitry of the IC of the circuit assembly of FIG. 1.

Reference will now be made to FIG. 3, which illustrates a circuit schematic depicting an embodiment of the pad circuitry 122 of IC 110. As illustrated, IC 110 includes contact site 120, pad circuitry 122, and test circuitry 130. Conductor 123 couples contact site 120 to external circuit 150. External circuit 150 can be another integrated circuit separate from IC 110 or some other circuit component in communication with IC 110.

Test circuitry 130 includes voltage generator 350, which produces reference voltage, $V_{REF}$. The reference voltage is supplied via conductor 140 to pad circuitry 122. Voltage generator 350 can be a digital-to-analog converter (DAC), or any of a number of other devices configured to provide a controllable DC voltage.

Pad circuitry 122 includes driver 310, comparator 320, and D flip-flop 330. Pad circuitry 122 receives an input along conductor 305 coupled to an input of driver 310. The output of driver 310 is coupled via conductor 315, contact site 120, and conductor 123 on its way to external circuit 150. Conductor 315 further couples the output of driver 310 to an input of comparator 320. The remaining input of comparator 320 is coupled via switch 345 to receive $V_{REF}$. The output of comparator 320, i.e., a digital signal labeled "COMPARE" is forwarded along conductor 325 to D flip-flop 330, which latches the comparator result, thus generating signal Q. Conductor 160 forwards signal Q to one or more devices configured to determine the voltage level of $V_{REF}$ that caused the steady-state value of the comparator to change. Alternatively, the COMPARE signal may be directly forwarded to these one or more devices. The described one or more devices may comprise data stores such as registers 352, 354 in communication with a DAC in voltage generator 350, a register within test circuitry 130 and external to the voltage generator, or a register within pad circuitry 122.

Register 352 is configured to receive a representation of the reference voltage when COMPARE or signal Q changes state. Thus, register 352 records the digital value that generated $V_{REF}$ when $V_{REF}$ is substantially equal to $V_{OUT}$ when INPUT is set to direct driver 310 to drive a first voltage to external circuit 150. Similarly, register 354 is configured to receive a representation of the reference voltage when COMPARE or signal Q changes state. Register 354 records the digital value that generated $V_{REF}$ when $V_{REF}$ is substantially equal to $V_{OUT}$ when INPUT is set to direct driver 310 to drive a second voltage to external circuit 150. Although depicted in FIG. 3 as being part of voltage generator 350, registers 352, 354 can be configured external to the voltage generator 350 and within test circuitry 130. Alternatively, registers 352, 354 can be configured in pad circuitry 122 or within other portions of IC 110.

Test circuitry 130 further includes logic 360. Logic 360 is configured to solve one or more equations responsive to the values in registers 352, 354 to determine resistance values associated with external circuit 150. More specifically, logic 360 determines resistance values for resistors $R_{RTERM1}$ 1152 and $R_{RTERM2}$ 154.

It should be understood that while the various circuit models illustrated in the described figures include resistors, other embodiments may include controllable termination transistors coupled between supply voltage $V_{DD}$ and node $V_{X1}$ and between node $V_{X1}$ and electrical ground. Additional embodiments may remove pull-up termination elements and apply a termination voltage and a controllable pull-down termination element coupled between the termination voltage and electrical ground.

As further shown in FIG. 3, switch 345 can be controlled to receive $V_{REF}$ from a voltage generator configured within IC 110. Alternatively, switch 345 can be controlled to receive $V_{REF}$ from a voltage generator external to IC 110 via conductor 355. When an external reference source is used, the reference voltage could be provided by an analog power supply among other devices.

In alternative embodiments, a receiver circuit, associated with driver 310 can be used as the comparator 320 so that test circuitry 130 does not require dedicated IC area. In this configuration, a scan register associated with the receiver can be used to capture the receiver output. Since each receiver typically has its own scan register (as per IEEE Standard 1149.1, for example), many target resistances may be tested simultaneously.

In operation, INPUT is driven by driver 310 to provide a driven signal $V_{OUT1}$ to external circuit 150 via contact site 120 and conductor 123. $V_{OUT1}$ is coupled to comparator 320. Comparator 320 compares $V_{OUT1}$ to a controllably adjustable reference signal $V_{REF}$. The comparator 320 outputs a logic 1 when the reference signal $V_{REF}$ exceeds the sampled signal $V_{OUT1}$. The output of the comparator, COMPARE, is captured by D flip-flop 330 and/or forwarded to register 352 and perhaps other devices configured to store a representation of the reference voltage level that caused the output of comparator 320 to change its steady-state value. Thereafter, INPUT is driven by driver 310 to provide a driven signal $V_{OUT2}$ to external circuit 150 via contact site 120 and conductor 123. The voltage level of $V_{OUT2}$ is not equal to that of $V_{OUT1}$. $V_{OUT2}$ is coupled to comparator 320. Comparator 320 compares $V_{OUT2}$ to a controllably adjustable reference signal $V_{REF}$. The comparator 320 outputs a logic 1 when the reference signal $V_{REF}$ exceeds the sampled signal $V_{OUT2}$. The output of the comparator, COMPARE, is captured by D flip-flop 330 and/or forwarded to register 354 and perhaps other devices configured to store a representation of the reference voltage level that caused the output of comparator 320 to change its steady-state value.

Figure 4:
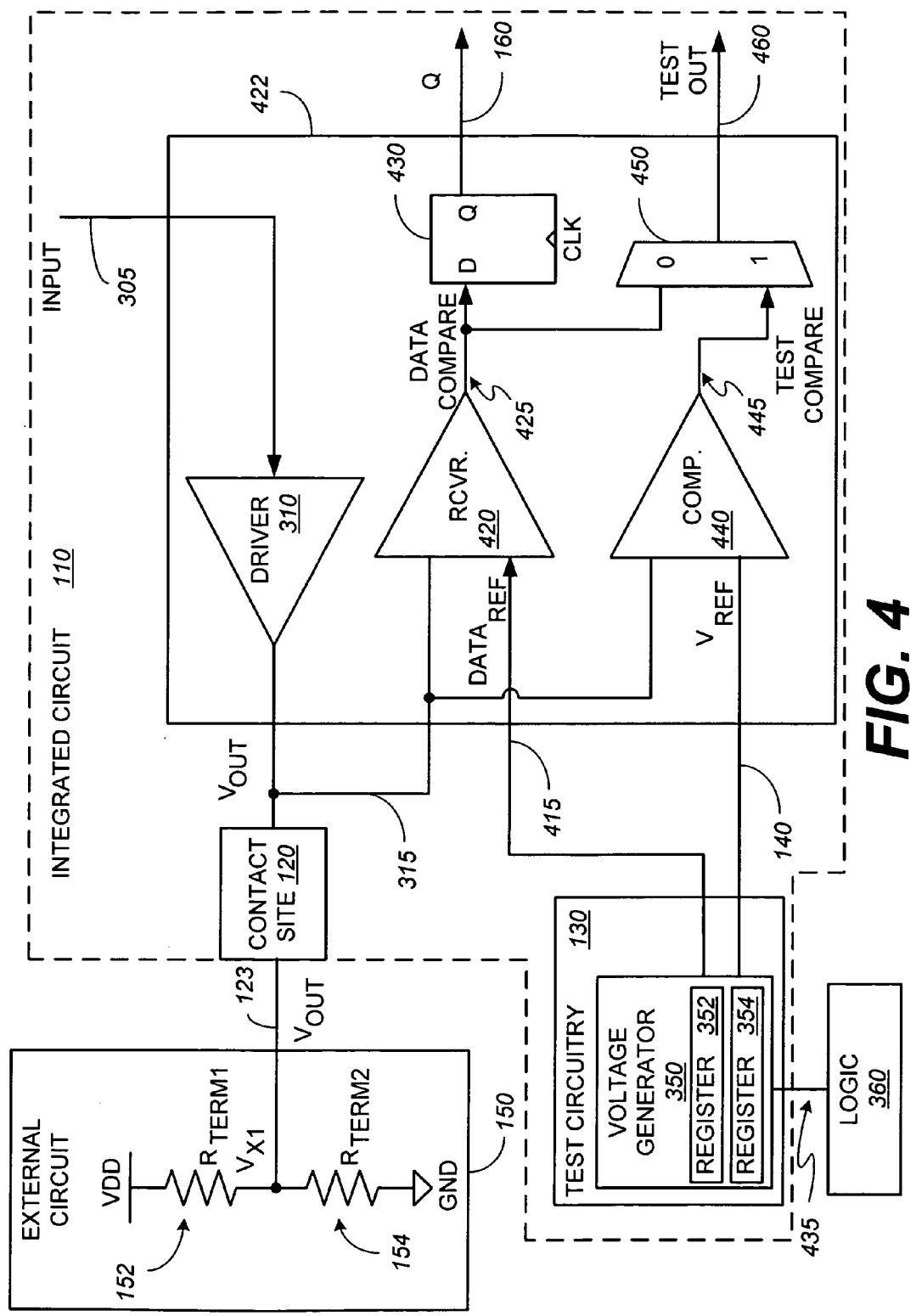
FIG. 4 is a circuit schematic of an alternative embodiment of the pad circuitry illustrated in FIG. 3.

FIG. 4 illustrates a circuit schematic depicting an alternative embodiment of the pad circuitry 122 of IC 110. As illustrated, IC 110 includes contact site 120, pad circuitry 422, and test circuitry 130. Conductor 123 couples contact site 120 to external circuit 150. Test circuitry 130 includes voltage generator 350, which produces reference voltage, $V_{REF}$, and reference voltage, $DATA_{REF}$. $V_{REF}$ is supplied via conductor 140 to pad circuitry 122. $DATA_{REF}$ is supplied via conductor 415 to pad circuitry 122.

Pad circuitry 122 includes driver 310, receiver 420, D flip-flop 430, comparator 440, and multiplexor 450. Pad circuitry 122 receives a signal labeled "INPUT" along conductor 305, which is coupled to an input of driver 310. The output of driver 310 is coupled via conductor 315, contact site 120, and conductor 123 to external circuit 150. Conductor 315 further connects the output of driver 310 to an input of receiver 420 and an input of comparator 440. The remaining input of receiver 420 is coupled via conductor 415 to receive $DATA_{REF}$. The remaining input of comparator 440 is coupled via conductor 140 to receive $V_{REF}$. The output of receiver 420 produces a digital signal labeled "DATA COMPARE" that is forwarded along conductor 425 to D flip-flop 430. D flip-flop 430 latches DATA COMPARE, thus generating signal Q. Conductor 160 forwards signal Q to one or more devices configured to receive the data signal. The output of comparator 440 generates a digital signal labeled "TEST COMPARE" that is forwarded along conductor 445 to multiplexor 450. Multiplexor 450 selects between TEST COMPARE and DATA COMPARE to generate signal TEST OUT. Conductor 460 forwards TEST OUT to one or more devices configured to determine the voltage level of $V_{REF}$ or $DATA_{REF}$ that caused the steady-state value of the associated comparator to change. The described one or more devices may comprise data stores such as registers 352, 354 in communication with a DAC in voltage generator 350 (not shown), one or more registers within test circuitry 130 and external to the voltage generator, or one or more registers within a device external to IC 110.

In operation, INPUT is driven by driver 310 to provide a driven signal $V_{OUT1}$ to external circuit 150 via contact site 120 and conductor 123. $V_{OUT1}$ is sampled or otherwise monitored by receiver 420 and comparator 440. Comparator 440 compares the sampled signal $V_{OUT1}$ to a controllable reference signal $V_{REF}$. The comparator 440 outputs a logic 1 when the reference signal $V_{REF}$ exceeds the sampled signal $V_{OUT1}$. The output of the comparator, TEST COMPARE, is captured by multiplexor 450 and output to register 352 to store a representation of the reference voltage level that caused the output of comparator 440 to change its steady-state value. Thereafter, INPUT is driven by driver 310 to provide a driven signal $V_{OUT2}$ to external circuit 150 via contact site 120 and conductor 123. The voltage level of $V_{OUT2}$ is not equal to that of $V_{OUT1}$. $V_{OUT2}$ is coupled to comparator 440. Comparator 440 compares $V_{OUT2}$ to a controllably adjustable reference signal $V_{REF}$. The comparator 440 outputs a logic 1 when the reference signal $V_{REF}$ exceeds the sampled signal $V_{OUT2}$. The output of the comparator, TEST COMPARE, is captured by multiplexor 450 and forwarded to register 354 and perhaps other devices configured to store a representation of the reference voltage level that caused the output of comparator 440 to change its steady-state value.

A test system further includes logic 360. Logic 360 is provided external to IC 110 and is coupled via connection 435 to receive the values in registers 352, 354. Logic 360 is configured to solve one or more equations responsive to the values in registers 352, 354 to determine resistance values associated with external circuit 150. More specifically, logic 470 determines resistance values for resistors $R_{RTERM1}$ 152 and $R_{RTERM2}$ 154.

Figures 5A, 5B:
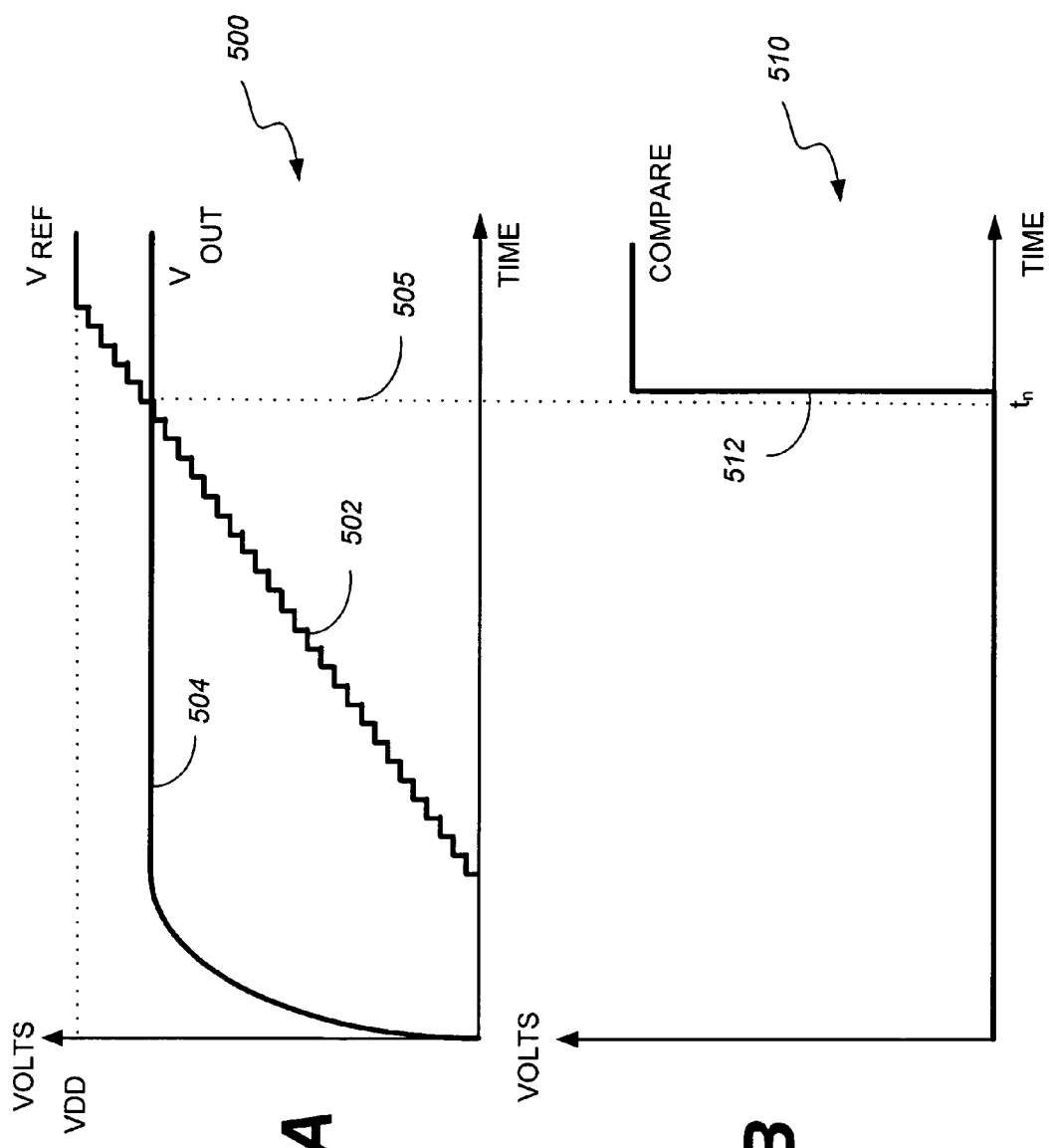
FIGS. 5A and 5B are graphs illustrating how a voltage is determined by the IC of FIG. 1.

FIGS. 5A and 5B are graphs 500 and 510 that illustrate how a voltage $V_{OUT}$ corresponding to a voltage output by IC 110 (FIG. 1) is determined. Graphs 500 and 510 illustrate increasing voltage from the bottom to the top of the graph with time increasing from left to right across the figures. As illustrated in graph 500, $V_{REF}$ 502 increases step-wise linearly from 0 volts to approximately $V_{DD}$. When directed to output a high voltage signal, IC 110 generates $V_{OUT}$ (FIG. 3), which in turn drives $V_{X1}$ in external circuit 150 (FIG. 3). Signal $V_{OUT}$ is represented by trace 504. At time, $t_n$, illustrated by dashed line 505, $V_{OUT}$ 504 is substantially equal to $V_{REF}$ 502. As illustrated in graph 510, at $t_n$, trace 512 representing COMPARE transitions from logic 0 to a logic 1. As described above, COMPARE can be used to direct test circuitry 130 to store a first value equal to the magnitude of $V_{REF}$ 502 when $V_{REF}$ 502 is substantially equal to $V_{OUT}$ 504.

In alternative embodiments $V_{REF}$ 502 can be initially set to $V_{DD}$ and decreased step-wise linearly over time until it is determined that $V_{REF}$ 502 and $V_{OUT}$ 504 are substantially equal. Similarly, COMPARE can be initially set to a logic 1 with test circuitry 130 configured to store a first value when COMPARE transitions to logic 0. Whether $V_{REF}$ 502 is adjusted to increase or decrease over time and whether test circuitry 130 is configured to react to COMPARE when COMPARE transitions from low to high voltage or when COMPARE transitions from high to low voltage, a second value can be identified and stored when $V_{OUT}$ 504 is adjusted to a different voltage level. In this way, the first and second values are associated with a logic high and a logic low, respectively. In an alternative embodiment, the first value is associated with a logic low and the second value is associated with a logic high.

Figure 6A:
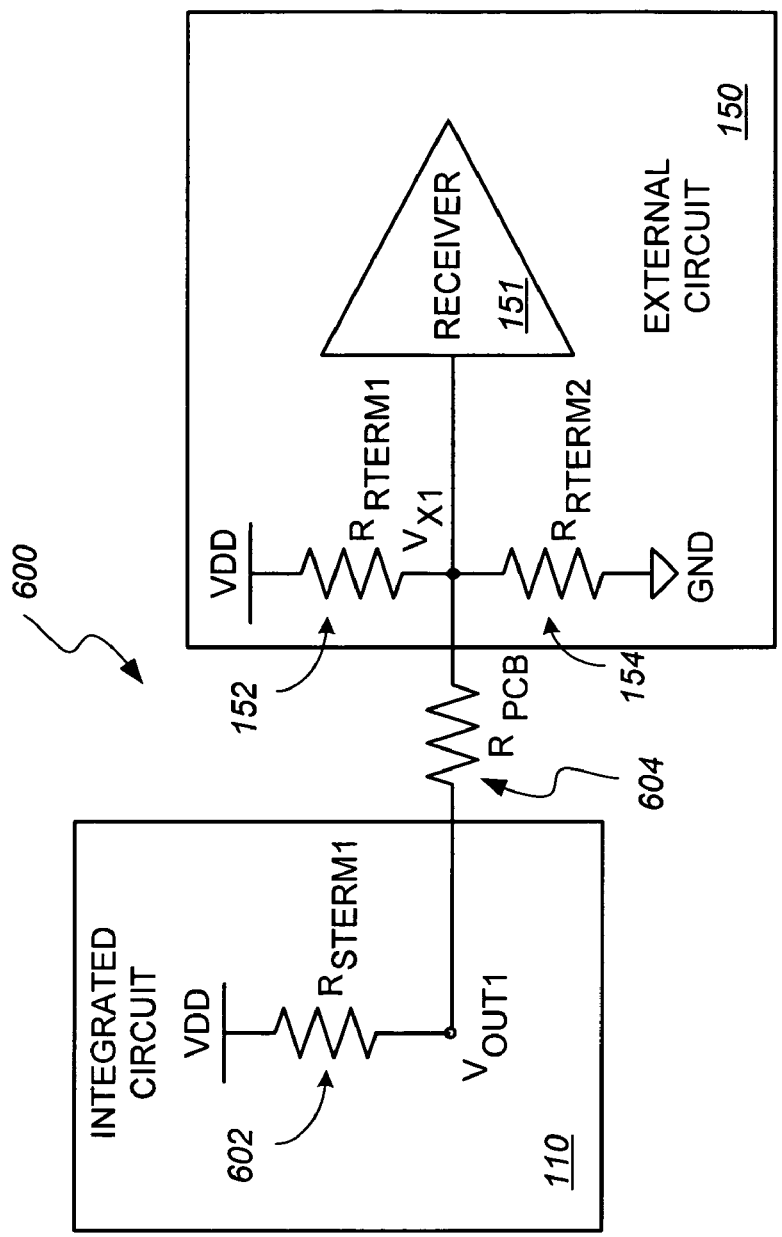
FIG. 6A is an embodiment of a circuit diagram depicting resistances along a path of a logic high signal transmitted by the IC of FIG. 1.

FIG. 6A is a schematic diagram illustrating a circuit 600 that models a connection between IC 110 and external circuit 150. As shown in FIG. 6A, the connection between IC 110 and external circuit 150 is represented by a resistive network comprising resistor $R_{STERM1}$ 602 (the series resistance of the driver 310 to $V_{DD}$), $R_{PCB}$ 604 (the resistance of the conductor between driver 310 and external circuit 150), and resistors $R_{RTERM1}$ 152 and $R_{RTERM2}$ 154 in the external circuit 150. The resistive network further comprises a node between resistance $R_{PCB}$ 604, resistor $R_{RTERM1}$ 152, and resistor $R_{RTERM2}$ 154. In the circuit model, a voltage $V_{X1}$ is associated with this node. In operation, IC 110 drives a signal having a first voltage, $V_{OUT1}$, to the external circuit 150. In the illustrated embodiment, the first voltage is a high voltage. $R_{RTERM1}$ 152 and $R_{RTERM2}$ 154 form a voltage divider which, when coupled to supply voltage $V_{DD}$, supplies a steady-state current from $V_{DD}$ to electrical ground, $V_{GND}$. The input stage of receiver 151 of the external circuit 150 is configured with a very high input resistance so little or no current flows into it, so it may be ignored. Summing the currents at node $V_{X1}$ results in the following equation:

$$(V_{DD}-V_{X1})/(R_{STERM1}+R_{PCB})+(V_{DD}-V_{X1})/R_{RTERM1}=(V_{X1}-V_{GND})/R_{RTERM2} \quad \text{EQ. 1}$$

Equation 1 has four unknowns ($R_{PCB}$, $V_{X1}$, $R_{RTERM1}$, $R_{RTERM2}$). $R_{STERM1}$ is known from testing the IC, either approximately since it was tested to a certain specification with a certain tolerance and passed, or (preferably) exactly, since it was measured and stored along with the unique IC identifier (such as a fused-based identification code or a visible bar code) and can be uniquely recalled from a database. The latter is preferred in cases where a high degree of accuracy of the measurement is valuable, but implies the need for unique IC identification and data transfer between manufacturing steps; the former is subject to a measurement accuracy tolerance proportional to the range of specification tolerance during IC testing, but vastly simplifies data transfer requirements. $V_{DD}$ and $V_{GND}$ are known because their values are set by the test system, and $V_{OUT}$ is measured (as shown in FIGS. 5A and 5B). Of the four remaining variables, two more may be eliminated by assuming that $R_{PCB}$ 604 (the resistance of the conductor between IC 110 and external circuit 150) is insignificant compared to the termination resistance provided by resistors $R_{RTERM1}$ 152 and $R_{RTERM2}$ 154. Thus, resistance $R_{PCB}$ 604, goes to zero and the voltage at $V_{X1}$ becomes the same as $V_{OUT1}$, the voltage at the first comparator input (see FIG. 3). With this assumption, equation 1 thus simplifies to include only two unknowns ($R_{RTERM1}$, $R_{RTERM2}$) as shown in equation 2:

$$(V_{DD}-V_{OUT})/(R_{STERM1})+(V_{DD}-V_{OUT})/R_{RTERM1}=(V_{OUT}-V_{GND})/R_{RTERM2} \quad \text{EQ. 2}$$

Figure 6B:
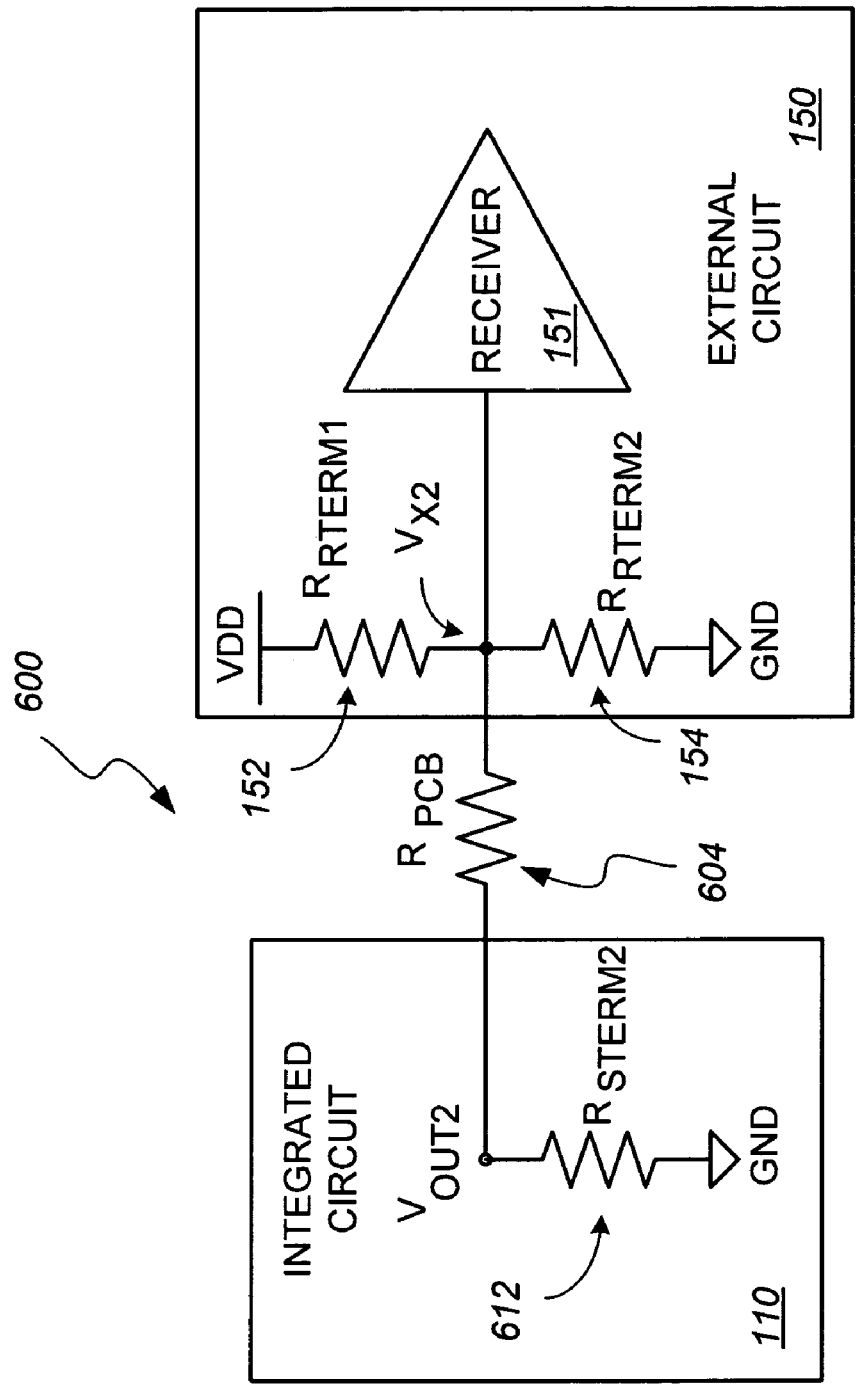
FIG. 6B is an embodiment of a circuit diagram depicting resistances along a path of a logic low signal transmitted by the IC of FIG. 1.

FIG. 6B is a schematic diagram illustrating a circuit 600 that models a connection between IC 110 and external circuit 150. As shown in FIG. 6B, the connection between IC 110 and external circuit 150 is represented by a resistive network comprising resistor $R_{STERM2}$ 612 (the series resistance of the driver 310 to ground), $R_{PCB}$ 604 (the resistance of the conductor between driver 310 and external circuit 150), and resistors $R_{RTERM1}$ 152 and $R_{RTERM2}$ 154 in the external circuit 150. The resistive network further comprises a node between resistance $R_{PCB}$ 604, resistor $R_{RTERM1}$ 152, and resistor $R_{RTERM2}$ 154. In the circuit model, a voltage $V_{X2}$ is associated with this node. In operation, IC 110 drives a signal having a second voltage, $V_{OUT2}$, to the external circuit 150. In the illustrated embodiment, the second voltage is a low voltage. $R_{RTERM1}$ 152 and $R_{RTERM2}$ 154 form a voltage divider, which when coupled to supply voltage $V_{DD}$ supplies a steady-state current from $V_{DD}$ to electrical ground, $V_{GND}$. The receiver 151 of the external circuit 150 is configured with a very high input resistance so little or no current flows into it. Applying the same assumptions and knowledge used to develop equation 2, the following equation can be calculated, again with only two unknowns ($R_{RTERM1}$ and $R_{RTERM2}$):

$$(V_{DD}-V_{OUT2})/R_{RTERM1}=(V_{OUT2}-V_{GND})/R_{STERM2}+(V_{OUT2}-V_{GND})/R_{RTERM2} \quad \text{EQ. 3}$$

Solving equation 2 for $R_{RTERM2}$ in terms of $R_{RTERM1}$ yields:

$$R_{RTERM2}=(V_{OUT1}-V_{GND})*R_{STERM1}*R_{RTERM1}/[(V_{DD}-V_{OUT1})(R_{STERM1}+R_{RTERM1})] \quad \text{EQ. 4}$$

Substituting this expression for $R_{RTERM2}$ in equation 4 for $R_{RTERM2}$ in equation 3 and then solving for $R_{RTERM1}$ yields:

$$R_{RTERM1}=[R_{STERM1}*R_{STERM2}(V_{DD}-V_{GND})(V_{OUT1}-V_{OUT2})]/[R_{STERM1}(V_{OUT1}-V_{GND})(V_{OUT2}-V_{GND})+R_{STERM2}(V_{DD}-V_{OUT1})(V_{OUT2}-V_{GND})] \quad \text{EQ. 5}$$

The result is two equations with two unknowns, which can be unambiguously solved. Thus, in one embodiment, test circuitry 130 can be configured with registers and combinational logic to perform equations 4 and 5 to identify resistance values for the termination resistors associated with a circuit external to IC 110. Alternatively, external agents, such as a software program or a piece of test equipment, may be configured to perform equations 4 and 5.

An alternative embodiment utilizing additional features of IC 110 is shown in FIG. 6C, which is a schematic diagram illustrating a circuit 610 that represents a connection between IC 110 and external circuit 150. As shown in FIG. 6C, the connection between IC 110 and external circuit 150 is represented by a resistive network comprising resistor $R_{STERM1}$ 620 (the series resistance of the driver 310 to $V_{DD}$), $R_{STERM2}$ 625 (the series resistance of the driver 310 to ground), resistance $R_{PCB}$ 604 (the resistance associated with the conductor between driver 310 and external circuit 150), and resistors $R_{TERM1}$ 152 and $R_{TERM2}$ 154. Resistor $R_{STERM1}$ 620 and resistor $R_{STERM2}$ 625 are controllably adjustable via a plurality of digital signals to adjust the resistances as may be required to provide the specified drive current from IC 110 due to variations caused by semiconductor process, voltage, and temperature. The resistive network further comprises a node between $R_{PCB}$ 604, $R_{TERM1}$ 152, and $R_{TERM2}$ 154. In the circuit model, a voltage $V_{X2}$ is associated with this node.

In operation, the normally mutually exclusive behavior of driver 310 (FIG. 3) on integrated circuit 110 is disabled, such that paths to both $V_{DD}$ and ground can be activated simultaneously. A comparator is configured such that it has a range of operation from about ¼ $V_{DD}$ to ¾ $V_{DD}$. The comparator is adjusted such that it is configured to trip when the voltage at node $V_{X1}$ exceeds ½ $V_{DD}$. Resistor $R_{STERM2}$ 625 is controllably adjusted to a fixed (and known) resistance. Thereafter, the aforementioned logic contention condition is introduced and varied between external circuit 150 and integrated circuit 110 by controllably adjusting the resistance of $R_{STERM1}$ 620 over time. Logic either internal to IC 110 or external to IC 110 is configured to receive a representation of the voltage at node $V_{X1}$ that caused the comparator to change its steady-state value. The logic is further configured to receive digital signals that represent the commanded strengths of the resistors $R_{STERM2}$ 625 and $R_{STERM1}$ 620. The logic having received the commanded strengths of the pull-down and pull-up drive elements and a representation of the $V_{X1}$ voltage that tripped the comparator can be configured to identify open and short circuit conditions or failure conditions as well as nominal circuit conditions or pass conditions. Care must be taken to size the driver devices and interconnecting wires and contacts appropriately to withstand the extended logic contention conditions present during test and measurement activity.

An additional test can be performed to determine if the pull-down termination resistance ($R_{RTERM2}$) is too weak. This additional test controllably removes resistor $R_{STERM2}$ 625, controllably adjusts the resistance of $R_{STERM1}$ 620 to a relatively low or weak resistance, and reconfigures the comparator to trip at ¾ VDD. If the comparator output is a logic 1 or high, the termination is too weak. This weak termination test can be used to identify open circuit faults in the termination network of the external circuit.

Similarly, an additional test can be performed to determine if the pull-up termination resistance ($R_{RTERM1}$) is too weak. This additional test controllably removes resistor $R_{STERM1}$ 620, controllably adjusts the resistance of $R_{STERM2}$ 625 to a relatively low or weak resistance, and reconfigures the comparator to trip at ¼ VDD. If the comparator output is a logic 0 or low, the termination is too weak. This weak termination test can be used to identify open circuit faults in the termination network of the external circuit.

FIGS. 7A and 7B are graphs 700 and 710 that illustrate how a voltage $V_{OUT}$ (i.e., $V_{OUT}$ from FIG. 6C) corresponding to a voltage received by IC 110 (FIG. 1) is determined. Graphs 700 and 710 illustrate increasing voltage from the bottom to the top of the graph with time increasing from left to right across the figures. As illustrated in graph 700, $V_{REF}$ 702 is held constant at approximately ½ $V_{DD}$. When the pull-down driver element (e.g., $R_{STERM2}$ 625) is fixed and the pull-up driver element (e.g., $R_{STERM1}$ 620) is configured to the low end of its controllable range, $V_{OUT}$ is drawn below ½ $V_{DD}$. As the pull-up driver element is controllably increased throughout its controllable range, $V_{OUT}$ increases accordingly as indicated by trace 704. At time $t_m$, illustrated by dashed line 705, $V_{OUT}$ 704 is substantially equal to $V_{REF}$ 702. As illustrated in graph 710, at $t_m$, trace 712 representing COMPARE transitions from 0 volts to a higher voltage. As described above, COMPARE can be used to direct logic to determine a condition associated with the termination network associated with a circuit external to IC 110.

The pull-up and pull-down driver elements described above are associated with a signal driver in a bi-directional transceiver on IC 110. Alternatively, the pull-up and pull-down elements can be associated with a receiver in a bi-directional transceiver on IC 110. In still other embodiments, IC 110 can be configured with one or more additional resistive elements (e.g., test resistors and/or test transistors) in any of a number of configurations to realize desired resistances on IC 110. Each of these methods can be used to generate logic contention between IC 110 and an external circuit under test coupled to IC 110.

Figure 8A:
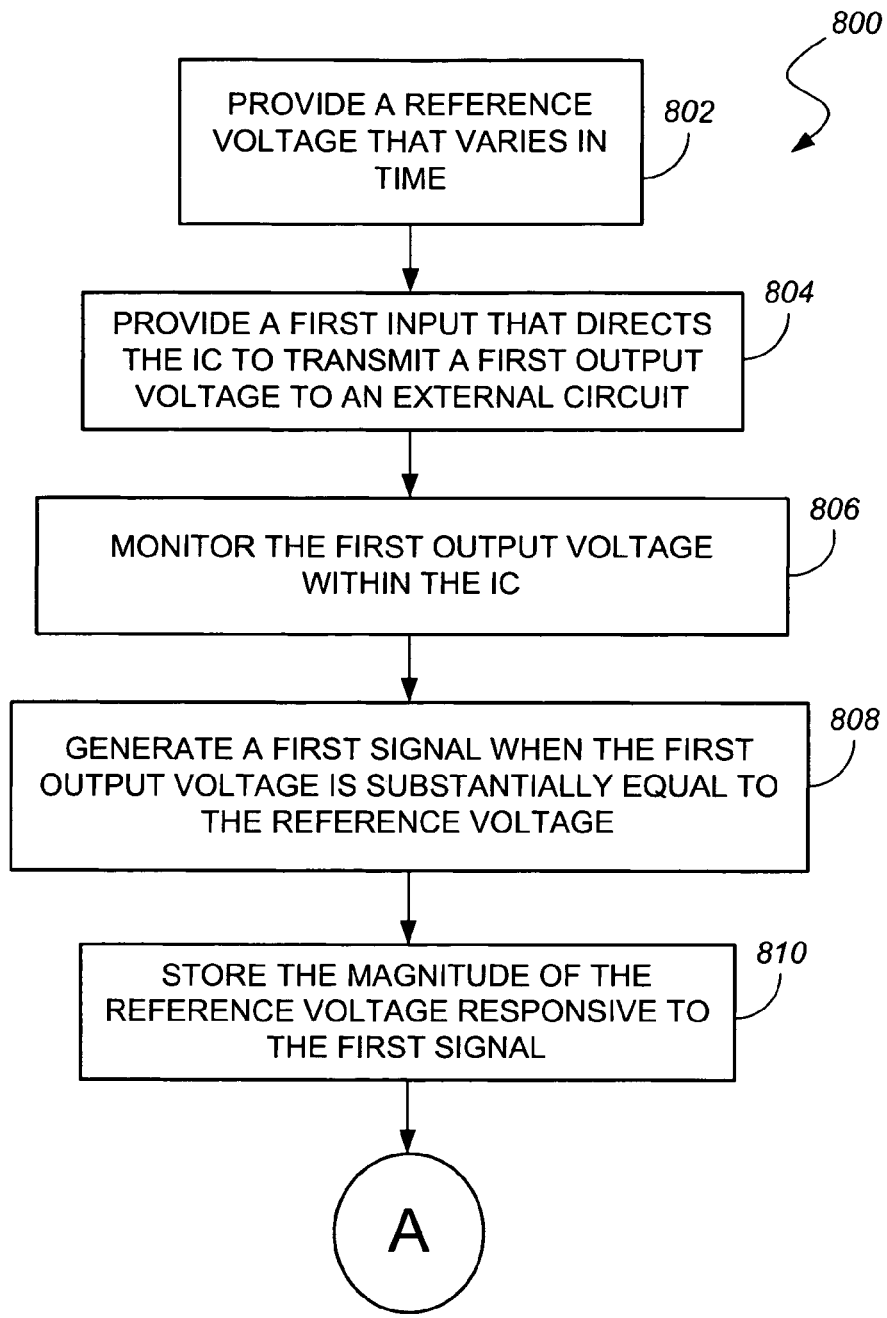
FIGS. 8A and 8B are flow diagrams depicting an embodiment of a method for testing target resistances.

FIG. 8A is a flow diagram illustrating an IC enabled method 800 for determining an electrical characteristic in a circuit assembly of a coupled circuit external to the IC. As indicated in block 802, a reference voltage that varies in time is provided. As described above, the provided reference voltage can be generated on the IC itself or supplied externally. A first input directs the IC to transmit a first output voltage to an external circuit, as shown in block 804. Next, as illustrated in block 806, the first output voltage is monitored from within the IC. The IC generates a first signal when the first output voltage is substantially equal to the reference voltage, as shown in block 808. The test system stores the magnitude of the reference voltage in response to the first signal, as shown in block 810.

Figure 8B:
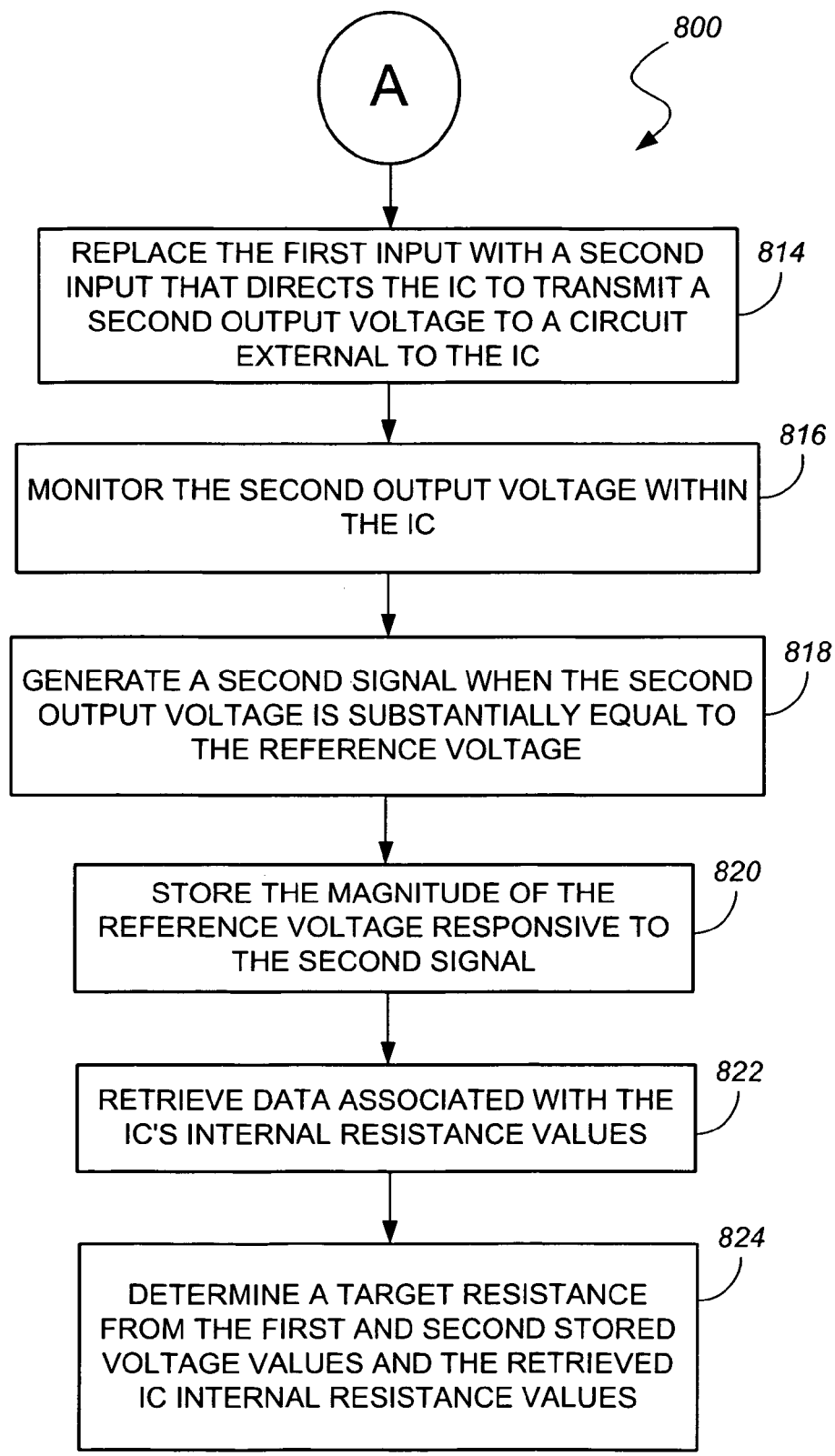

FIG. 8B is a flow diagram illustrating a continuation of the method 800 for determining an electrical characteristic in a circuit assembly. As shown in block 814, method 800 continues by replacing the first input with a second input that directs the IC to transmit a second output voltage to the external circuit. As described above, the second output voltage is different than the first output voltage. As illustrated in block 816, the second output voltage is monitored from within the IC. The IC generates a second signal when the second output voltage is substantially equal to the reference voltage, as shown in block 818. The test system stores the magnitude of the reference voltage in response to the second signal, as shown in block 820. The values of the resistances internal to the IC (RSTERM1 and RSTERM2) are retrieved, as indicated in block 822. Next, as shown in block 824, the test system determines a target resistance using the first and second stored voltage values along with the retrieved internal resistance values by solving equations 4 and 5 presented above. A determination may then be made as to whether the target resistance meets a predetermined specification requirement. For example, the target resistance may meet a specification requirement if it falls within a range of permissible values.

Figure 9:
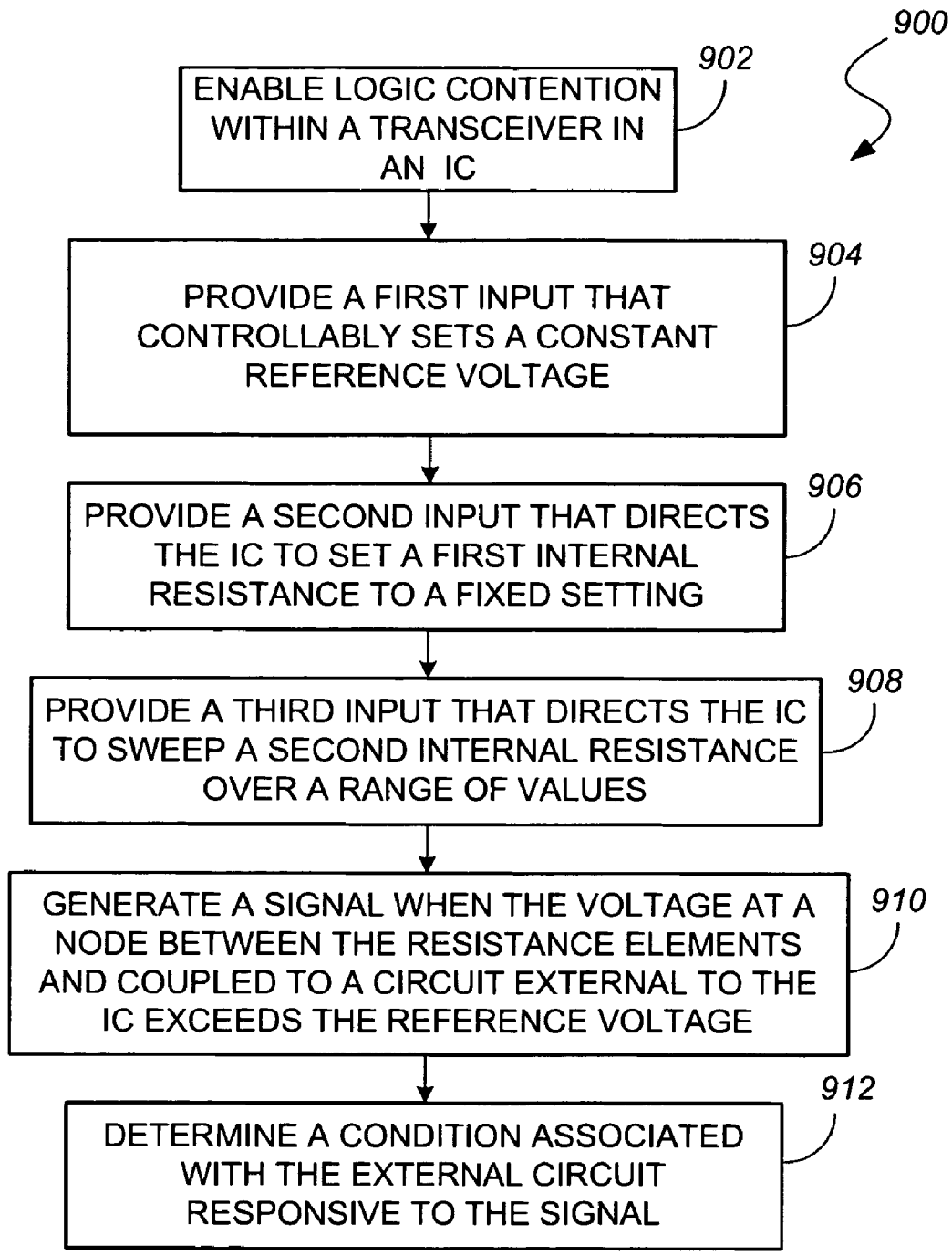
FIG. 9 is a flow diagram depicting an embodiment of an alternative method for testing target resistances.

FIG. 9 is a flow diagram illustrating an alternative IC enabled method for testing an external circuit. Method 900 begins with block 902 where a transceiver is allowed to produce a logic contention situation in the IC. Thereafter, a first input controllably sets a reference voltage that is substantially constant in magnitude over time, as indicated in block 904. In block 906, a second input directs the IC to set a first resistor element on the IC to a select fixed value. In block 908, a third input controllably directs the IC to sweep across a range of values of a second resistance element on the IC. In block 910, the IC generates a signal when the voltage at a node between the first and second resistance elements and coupled to the circuit external to the IC exceeds the reference voltage. Thereafter, as indicated in block 912, a test system determines a condition associated with the external circuit responsive to the signal.

The signal generated in block 910 can be used to determine a ratio of the actual termination voltage on the external circuit to the supply voltage. A ratio of the actual termination voltage on the external circuit to the supply voltage can be used to identify a pass/fail status of the resistance of the external device.

Note that in some alternative embodiments the functions noted in the various blocks may occur out of the order depicted in the figures. For example, two or more blocks shown in succession in FIG. 8A may, in fact, be executed substantially concurrently. By way of further example, two or more blocks may, in fact, be executed in the reverse order or in some other order depending upon the functionality involved.

The foregoing description has been presented for purposes of illustration and description. It is not intended to be exhaustive or to limit the scope of the claims to the precise forms disclosed. Modifications or variations are possible in light of the above teachings. The embodiments discussed, however, were chosen and described to enable one of ordinary skill in the art to utilize various systems and methods for testing target resistances in circuit assemblies. All such modifications and variations are within the scope of the appended claims when interpreted in accordance with the breadth to which they are fairly and legally entitled.

What is claimed is:

1. An integrated circuit (IC) enabled method for determining an electrical characteristic in a circuit assembly of a coupled circuit external to the IC, the method comprising:
    providing a reference voltage that varies in magnitude over time;
    providing a first input that directs the IC to transmit a first output voltage to a circuit external to the IC;
    monitoring the first output voltage within the IC;
    generating a first signal when the first output voltage is substantially equal to the reference voltage;
    storing the magnitude of the reference voltage responsive to the first signal;
    replacing the first input with a second input that directs the IC to transmit a second output voltage different from the first output voltage to the circuit external to the IC;
    monitoring the second output voltage within the IC;
    generating a second signal when the second output voltage is substantially equal to the reference voltage;
    storing the magnitude of the reference voltage responsive to the second signal; and
    determining a value of an electrical characteristic of the circuit external to the IC responsive to the first and second inputs and the reference voltage.

2. The method of claim 1, wherein providing a reference voltage comprises linearly varying the reference voltage.

3. The method of claim 2, wherein varying the reference voltage comprises increasing the reference voltage.

4. The method of claim 2, wherein varying the reference voltage comprises decreasing the reference voltage.

5. The method of claim 1, wherein providing a reference voltage comprises controlling a voltage generator on the IC.

6. The method of claim 1, wherein providing a first input comprises coupling the circuit assembly to a test system.

7. The method of claim 1, wherein providing a first input comprises forwarding a data signal from a test circuit within the IC.

8. The method of claim 1, wherein monitoring the first output voltage comprises coupling a conductor to a first comparator input.

9. The method of claim 1, wherein generating a first signal comprises coupling a second comparator input to the reference voltage.

10. The method of claim 1, wherein storing the magnitude of the reference voltage comprises forwarding a representation of a value from a digital to analog converter.

11. The method of claim 1, further comprising: using the first and second values to determine a target resistance.

12. The method of claim 11, further comprising: associating a pass condition with the circuit external to the IC when the target resistance is within an acceptable range of values.

13. The method of claim 11, further comprising: associating a fail condition with the circuit external to the IC when the target resistance is outside of an acceptable range of values.

14. The method of claim 11, further comprising: retrieving stored data uniquely associated with the IC's internal resistance values to improve the accuracy of determining a target resistance.

15. A system for determining a target resistance of an external circuit coupled to an integrated circuit (IC), comprising:
    an IC having test circuitry applying a reference voltage that varies over time and first and second output voltages, the first and second output voltages having respective values that are different from the other output voltage;
    a first data store for recording a first reference voltage value responsive to a first stimulus from within the IC when the reference voltage is substantially equal to the first output voltage;

a second data store for recording a second reference voltage value responsive to a second stimulus from within the IC when the reference voltage is substantially equal to the second output voltage; and a logic configured to determining first and second values for an electrical characteristic of the external circuit responsive to the first and second reference voltage values.

16. The system of claim 15, wherein the IC comprises a driver configured to apply the first and second output voltages to the external circuit responsive to an input signal.

17. The system of claim 15, wherein the IC comprises a comparator configured to measure the first and second responses.

18. The system of claim 17, wherein the comparator generates a signal that changes when the first and second output voltages exceed the reference voltage.

19. The system of claim 17, wherein the comparator generates a signal that changes when the first and second output voltages are less than the reference voltage.

* * * * *

UNITED STATES PATENT AND TRADEMARK OFFICE
CERTIFICATE OF CORRECTION

| | |
|---|---|
| PATENT NO. | : 7,411,407 B2 |
| APPLICATION NO. | : 11/581203 |
| DATED | : August 12, 2008 |
| INVENTOR(S) | : Rearick et al. |

It is certified that error appears in the above-identified patent and that said Letters Patent is hereby corrected as shown below:

In column 13, line 5, after "logic" delete "configured to".

Signed and Sealed this

Eleventh Day of November, 2008

JON W. DUDAS
*Director of the United States Patent and Trademark Office*